US009640468B2

(12) United States Patent
Fontana

(10) Patent No.: US 9,640,468 B2
(45) Date of Patent: May 2, 2017

(54) PROCESS FOR MANUFACTURING A PACKAGE FOR A SURFACE-MOUNT SEMICONDUCTOR DEVICE AND SEMICONDUCTOR DEVICE

(71) Applicant: STMicroelectronics S.r.l., Agrate Brianza (IT)

(72) Inventor: Fulvio Vittorio Fontana, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/839,408

(22) Filed: Aug. 28, 2015

(65) Prior Publication Data

US 2016/0190046 A1   Jun. 30, 2016

(30) Foreign Application Priority Data

Dec. 24, 2014   (IT) .............................. TO2014A1106

(51) Int. Cl.
*H01L 23/495* (2006.01)
*H01L 21/56* (2006.01)
(Continued)

(52) U.S. Cl.
CPC .... *H01L 23/49541* (2013.01); *H01L 21/4825* (2013.01); *H01L 21/4842* (2013.01); *H01L 21/561* (2013.01); *H01L 21/565* (2013.01); *H01L 21/568* (2013.01); *H01L 23/3114* (2013.01); *H01L 23/4952* (2013.01); *H01L 23/49548* (2013.01); *H01L 23/49503* (2013.01); *H01L 23/49579* (2013.01);
(Continued)

(58) Field of Classification Search
CPC ........... H01L 23/49503; H01L 21/4842; H01L 21/4825; H01L 21/565; H01L 23/4952; H01L 23/49541; H01L 21/561; H01L 21/568; H01L 23/3114; H01L 23/49548; H01L 23/49579; H01L 2224/16227; H01L 2224/32245; H01L 2224/48091; H01L 2224/48247; H01L 2224/73204; H01L 2224/73265; H01L 2224/81005; H01L 2224/83005; H01L 2224/85005; H01L 2224/92247; H01L 2224/97; H01L 2225/1029
USPC .......................................... 257/676; 438/123
See application file for complete search history.

(56) References Cited

U.S. PATENT DOCUMENTS 6,215,179 B1   4/2001   Ohgiyama
2005/0116321 A1   6/2005   Li et al.
(Continued)

FOREIGN PATENT DOCUMENTS

WO   WO-2013174418 A1   11/2013

OTHER PUBLICATIONS

Italian Search Report and Written Opinion for IT TO2014A001106 dated Aug. 11, 2015 (8 pages).
(Continued)

*Primary Examiner* — Yasser A Abdelaziez
(74) *Attorney, Agent, or Firm* — Gardere Wynne Sewell LLP

(57) ABSTRACT

A surface-mount electronic device includes a body of semiconductor material, and a lead frame that includes a plurality of contact terminals. The plurality of contact terminals is electrically connected to the semiconductor body. The contact terminals are formed of sintered material.

21 Claims, 18 Drawing Sheets

(51) Int. Cl.
*H01L 21/48* (2006.01)
*H01L 23/31* (2006.01)

(52) U.S. Cl.
CPC ............... *H01L 2224/16227* (2013.01); *H01L 2224/32245* (2013.01); *H01L 2224/48091* (2013.01); *H01L 2224/48247* (2013.01); *H01L 2224/73204* (2013.01); *H01L 2224/73265* (2013.01); *H01L 2224/81005* (2013.01); *H01L 2224/83005* (2013.01); *H01L 2224/85005* (2013.01); *H01L 2224/92247* (2013.01); *H01L 2224/97* (2013.01); *H01L 2225/1029* (2013.01); *H01L 2225/1058* (2013.01); *H01L 2924/181* (2013.01)

(56) References Cited

U.S. PATENT DOCUMENTS

| | | | |
|---|---|---|---|
| 2007/0001278 A1* | 1/2007 | Jeon | H01L 21/561 257/676 |
| 2011/0115061 A1* | 5/2011 | Krishnan | H01L 23/49541 257/676 |
| 2011/0248392 A1* | 10/2011 | Javier | H01L 21/4828 257/676 |
| 2012/0211889 A1* | 8/2012 | Edwards | H01L 21/4821 257/746 |
| 2013/0037927 A1 | 2/2013 | Rogren | |

OTHER PUBLICATIONS

EP Search Report and Written Opinion for EP 15200614 dated Apr. 25, 2016 (9 pages).

* cited by examiner

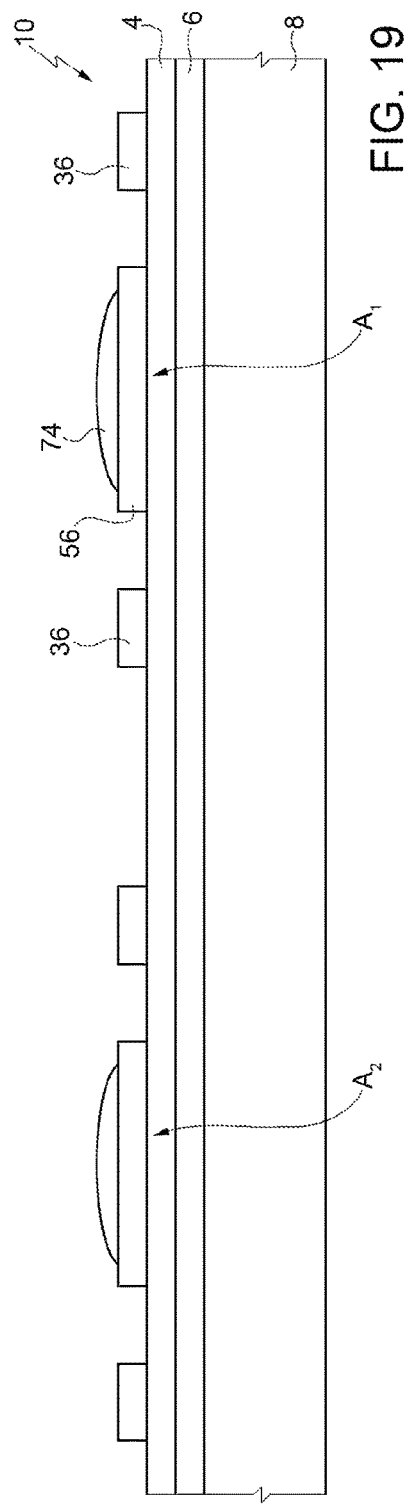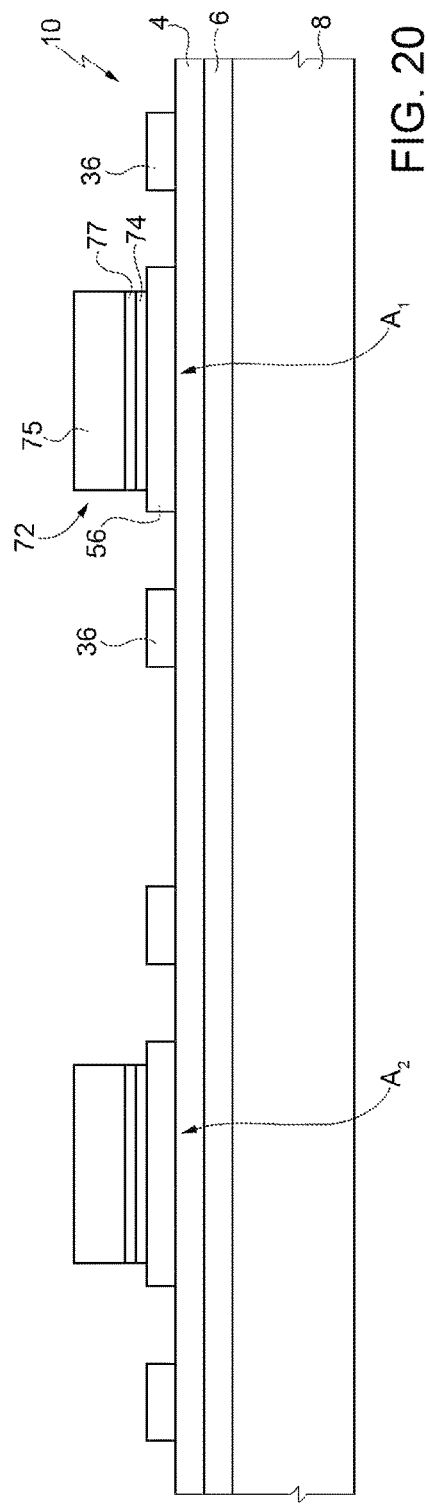

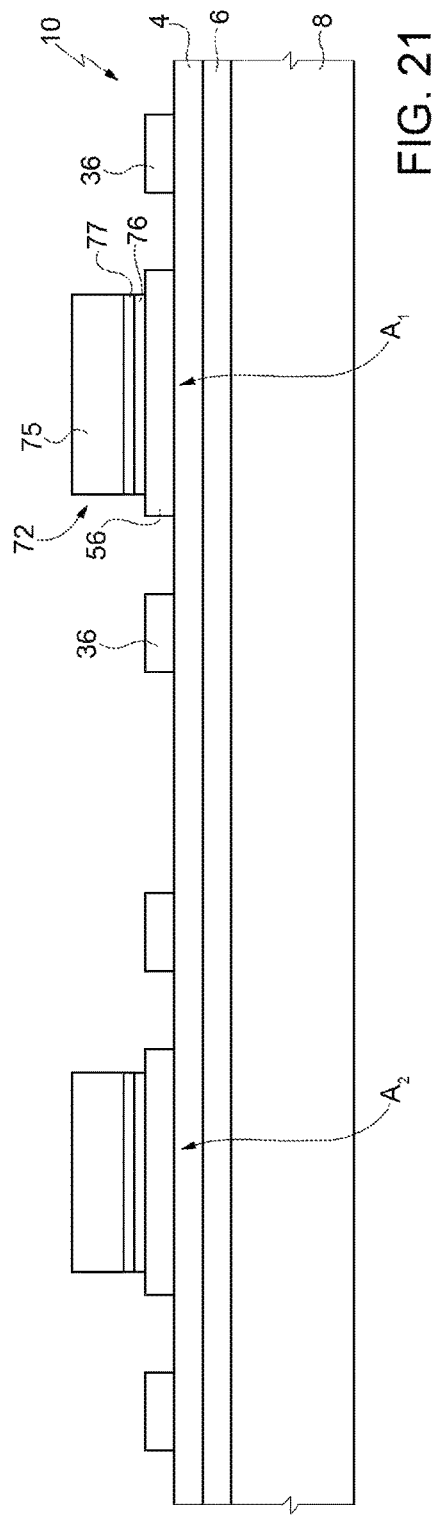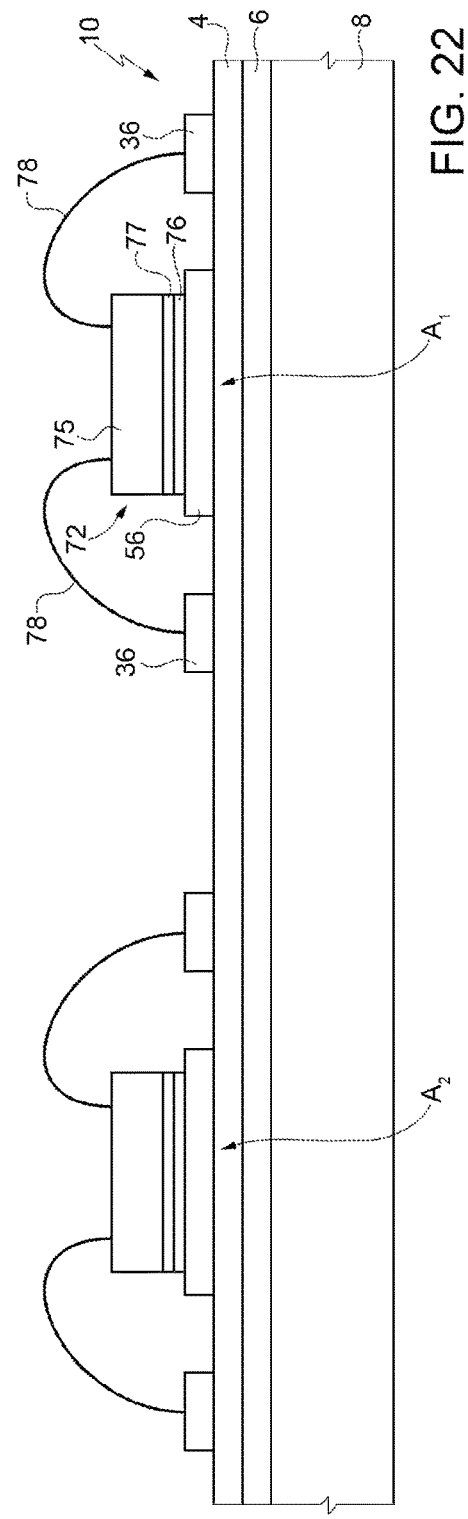

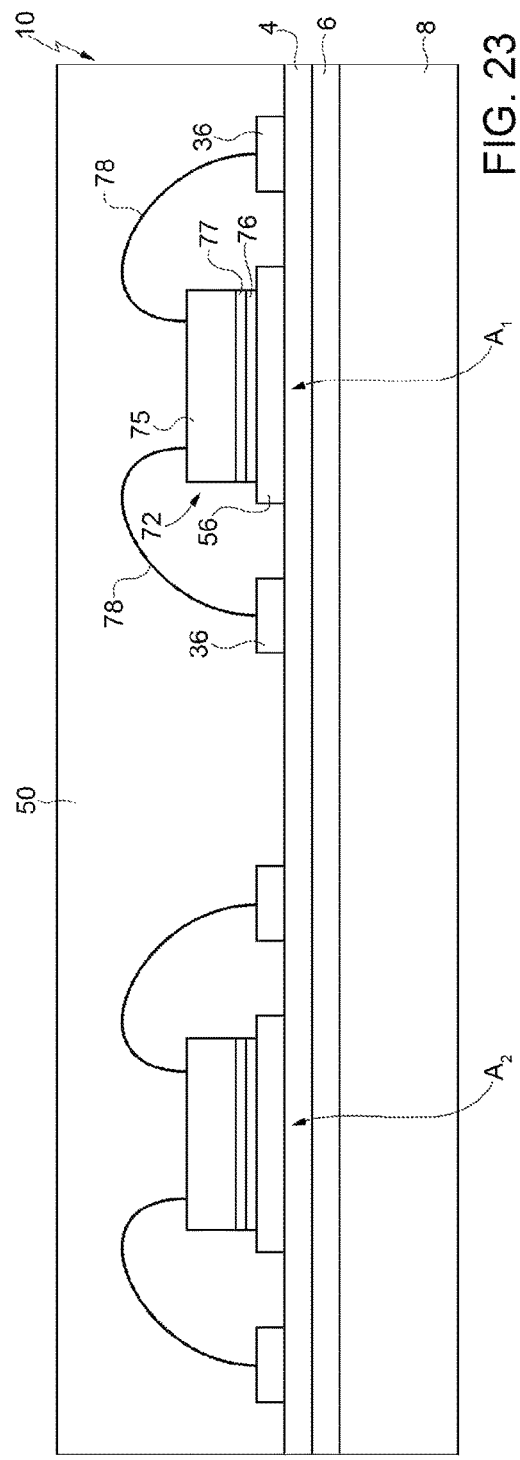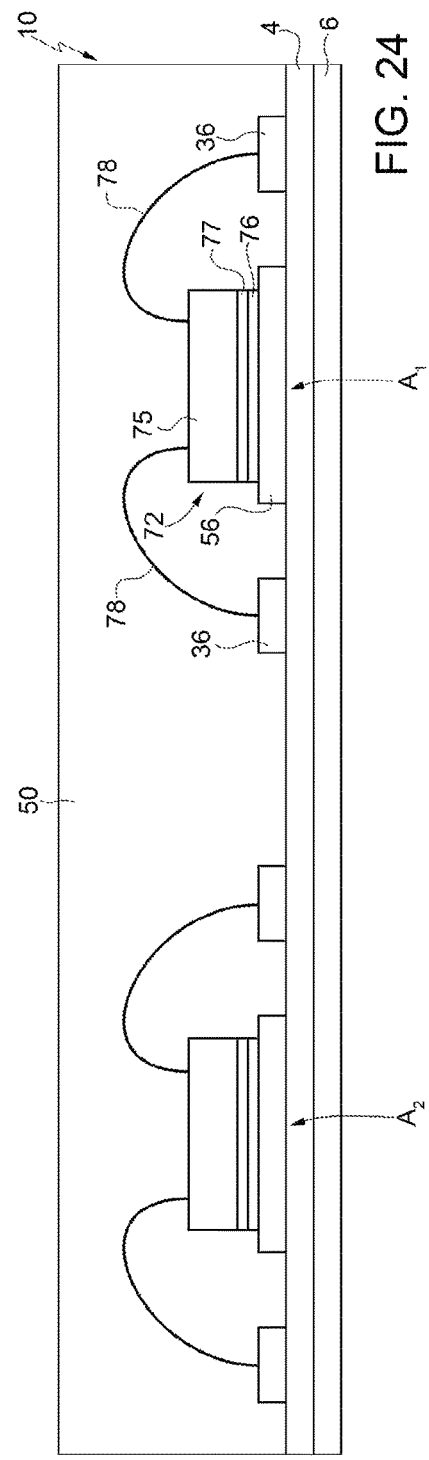

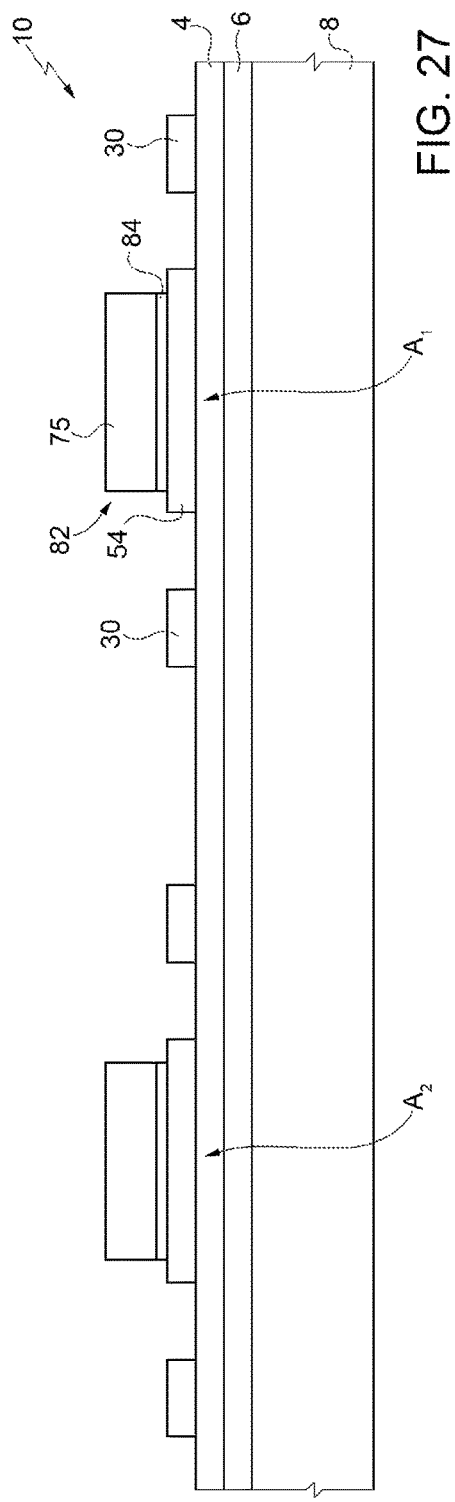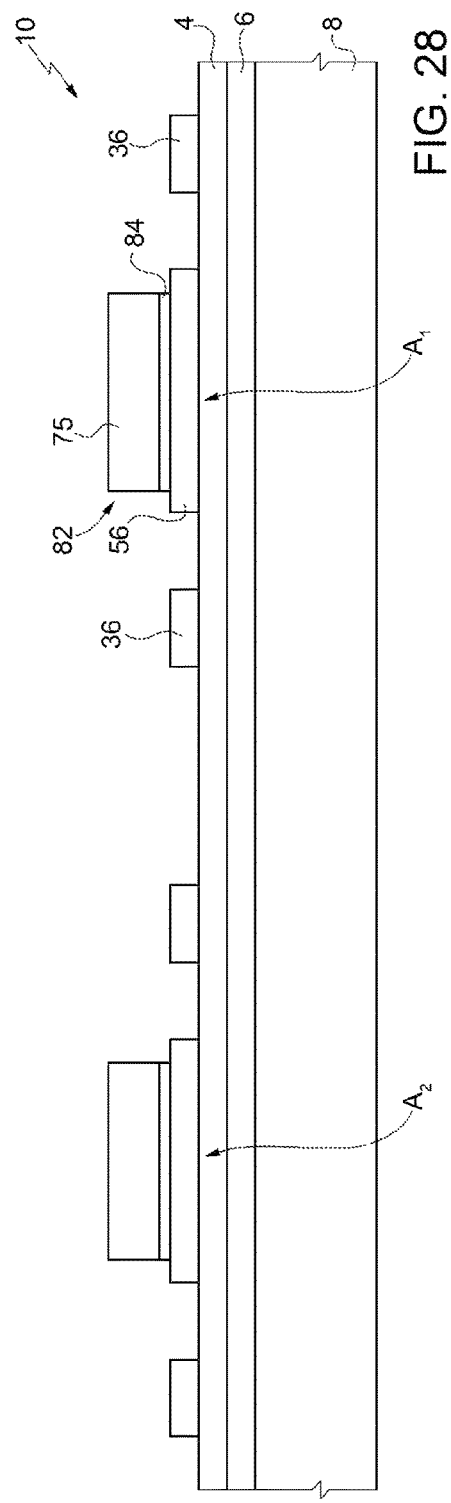

US 9,640,468 B2

PROCESS FOR MANUFACTURING A PACKAGE FOR A SURFACE-MOUNT SEMICONDUCTOR DEVICE AND SEMICONDUCTOR DEVICE

PRIORITY CLAIM

This application claims the priority benefit of Italian Patent Application No. TO2014A001106, filed on Dec. 24, 2014, the content of which is hereby incorporated by reference in its entirety to the maximum extent allowable by law.

TECHNICAL FIELD

The present invention relates to a process for manufacturing a package for a surface-mount semiconductor device, as well as to the corresponding semiconductor device.

BACKGROUND

Semiconductor devices, for example integrated circuits and micro-electro-mechanical systems (MEMS) devices, are encapsulated within corresponding packages, which perform functions of protection and interfacing with the outside world. For instance, there are known packages that enable so-called surface mounting on a printed-circuit board (PCB).

In greater detail, surface-mount packages include, for example, the so-called packages of a "quad-flat no-leads" (QFN) type, also known as "micro-lead frame" (MLF) or "small-outline no-leads" (SON) packages.

In general, with reference, for example, to a package of a QFN type, which includes a region of resin, inside which is a lead frame, which in turn forms at least one array of terminals that are exposed by and/or extend from a bottom surface of the package. An example of process for manufacturing a package comprising a lead frame is described in U.S. Patent Application Publication No. 2005/0116321 by Felix et al., which is hereby incorporated by reference.

Traditionally, lead frames are manufactured in strips, which are subsequently used in the manufacturing processes. This being said, even though the technologies that enable production of packages starting from lead-frame strips are by now well consolidated, they are still relatively costly. Further, the packages thus obtained have relatively high weights.

There is a need for a package for a semiconductor device that will overcome at least in part the drawbacks of the known art.

SUMMARY

A surface-mount electronic device includes a body of semiconductor material, and a lead frame that includes a plurality of contact terminals that are electrically connected to the body of semiconductor material. The plurality of contact terminals is formed of a sintered material.

In one embodiment, the lead frame includes a plurality of pads and a plurality of tracks disposed on an insulating region. Each track of the plurality of tracks electrically connects a corresponding pad to a corresponding contact terminal of the plurality of contact terminals.

In an alternate embodiment, the surface-mount electronic device includes a die pad, and the body of semiconductor material is arranged on the die pad and is electrically connected to the plurality of contact terminals by wire bonds.

A process for manufacturing a surface-mount electronic device includes forming a plurality of preliminary contact regions of a sinterable material on a supporting structure. A chip including a semiconductor body is mechanically coupled to the supporting structure. The sinterable material is sintered such that each preliminary contact region forms a corresponding sintered preliminary contact.

BRIEF DESCRIPTION OF THE DRAWINGS

For a better understanding of the present invention, preferred embodiments thereof are now described purely by way of non-limiting example and with reference to the attached drawings, wherein:

FIGS. 19-25 are schematic cross-sectional views of portions of an intermediate structure, during successive steps of an embodiment of the manufacturing process;

FIGS. 27 and 28 are schematic cross-sectional views of portions of an intermediate structure, during successive steps of an embodiment of the manufacturing process;

DETAILED DESCRIPTION

Figure 1:
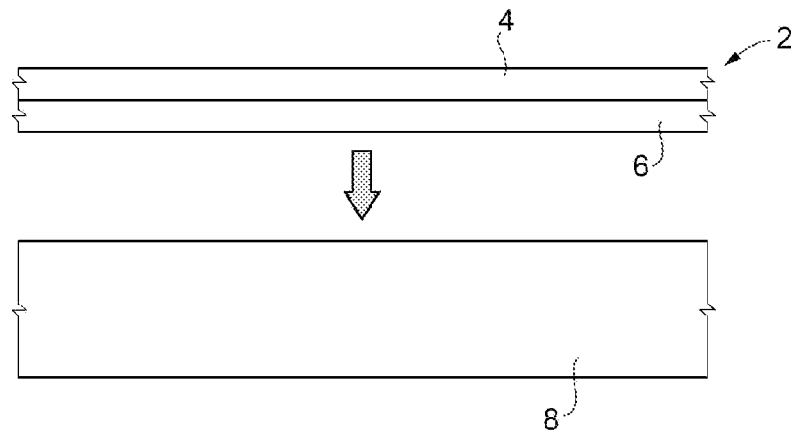
FIGS. 1-3 are schematic cross-sectional views of portions of an intermediate structure, during successive steps of an embodiment of the present manufacturing process.

FIG. 1 shows a supporting structure 2 of a water-soluble type, which comprises a first layer 4 and a second layer 6, referred to hereinafter as first supporting layer 4 and second supporting layer 6. None of the Figures are to scale.

The first and second supporting layers 4, 6 are arranged in contact with one another and form an adhesive tape of a known type. The first supporting layer 4 is formed, for example, by a film of polyvinyl acetate (PVA) or polyvinyl pyrrolidone (PVP), which may have a thickness of, for example, between 10 µm and 30 µm. The second layer 6 is formed, for example, by a pressure-sensitive adhesive film (PSA film) soluble in water, which may have a thickness of, for example, between 20 µm and 30 µm. More in particular, the second supporting layer 6 may be formed, for example, by a gel containing a mixture of polyvinyl acetate and sodium silicate.

As illustrated in FIG. 1, according to the present manufacturing method, the supporting structure 2 is mechanically coupled to a plate 8, which is made, for example, of steel and has a thickness of, for instance, between 0.2 mm and 0.5 mm, for functioning as stiffener.

Figure 2:
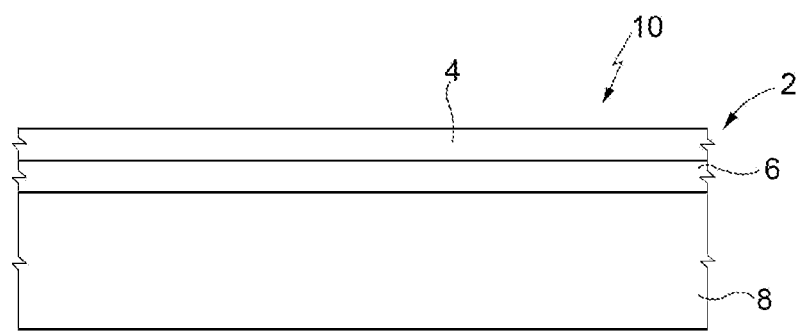

More in particular, the supporting structure 2 is laminated; i.e., it is arranged on the plate 8 in such a way that the second supporting layer 6 contacts the plate 8. Lamination is carried out, for example, in a pressurized oven, with a pressure of 5 bar and a temperature of 200° C., for eliminating the air bubbles that may develop following upon heating of the second supporting layer 6. In this way, the first supporting layer 4 is glued to the plate 8, due to the action of gluing performed by the second supporting layer 6, as illustrated in FIG. 2. There is thus formed an assembly 10, i.e., an intermediate structure, which has a thickness of, for example, between 0.23 mm and 0.56 mm.

Figure 3:
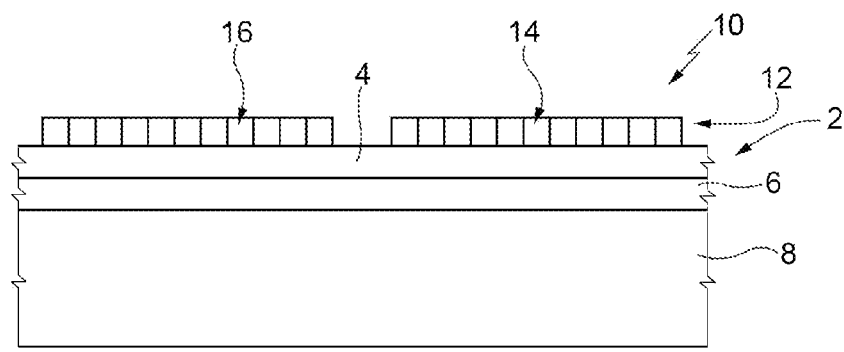

Next, as illustrated in FIG. 3, formed on top of the first supporting layer 4 is a third layer 12 of dielectric material, such as, for example, an acrylic adhesive resin curable with ultraviolet radiation. The third layer 12 may be formed in a known manner, for example by silk-screen printing and subsequent curing. Further, the third layer 12 has a thickness of, for example, between 10 µm and 30 µm.

Figure 4:
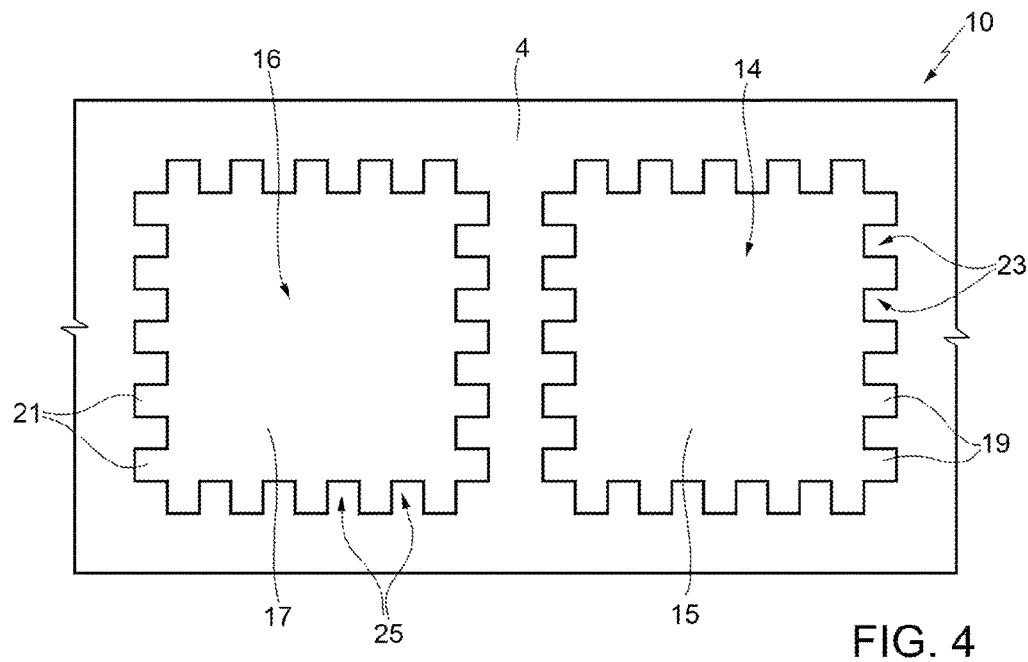
FIGS. 4, 5, and 7 are schematic top plan views of portions of an intermediate structure, during successive steps of an embodiment of the present manufacturing process.

As illustrated also in FIG. 4, the third layer 12 forms a plurality of dielectric regions. In particular, illustrated in FIG. 4 are a first dielectric region 14 and a second dielectric region 16, referred to hereinafter as first and second base regions 14, 16. Generally, the first and second base regions 14, 16 are the same as one another.

The first and second base regions 14, 16 are physically separated from one another and are laterally staggered. Furthermore, in top plan view each of the first and second base regions 14, 16 is shaped like a postage stamp; i.e., it has a main body (designated, respectively, by 15 and 17) with a rectangular or square shape, from the perimeter of which there depart, towards the outside, a plurality of teeth, i.e., projecting elements, which also have a rectangular or square shape. In FIG. 4, the teeth of the first base region 14 are designated by 19, whereas the teeth of the second base region 16 are designated by 21.

In turn, the teeth define a plurality of recesses, open at the top and delimited at the bottom by the first supporting layer 4. In FIG. 4, the recesses defined by the first base region 14 are designated by 23, whereas the recesses defined by the second base region 16 are designated by 25.

For brevity, the operations of the present manufacturing method are described with reference to the portion of intermediate structure 10 including the first base region 14, except where otherwise specified.

Figure 5:
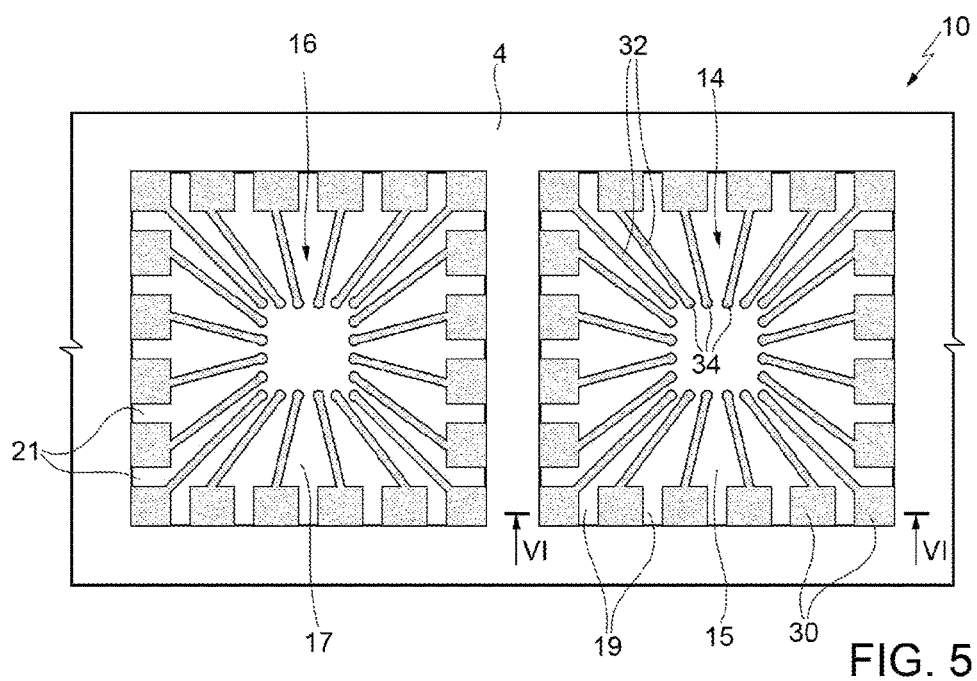

As illustrated in FIG. 5, there are subsequently formed a plurality of preliminary contact regions 30, a plurality of preliminary track regions 32, and a plurality of preliminary pad regions 34, of a conductive type.

In detail, the preliminary contact regions 30, the preliminary track regions 32, and the preliminary pad regions 34 are formed, by a process of silk-screen printing, from the same sintering paste of a known type; for example, the sintering paste may be formed by transient-phase liquid sintering (TPLS).

In greater detail, the sintering paste may include metal microparticles, which have equivalent diameters of, for example, between 10 µm and 30 µm.

In even greater detail, the sintering paste may include, for example, copper and tin microparticles, bonded by an epoxy resin. In this case, if arranged in an environment at a temperature of 220° C. and with low oxygen content, the microparticles form a copper-tin intermetallic compound. Once again by way of example, the sintering paste may likewise be formed by copper microparticles coated with silver and dispersed in a solvent. In this case, if the sintering paste is heated up to 170° C., the solvent evaporates.

In greater detail, each preliminary contact region 30 is formed within a corresponding recess 23 of the first base region 14 for contacting the underlying first supporting layer 4.

Figure 6:
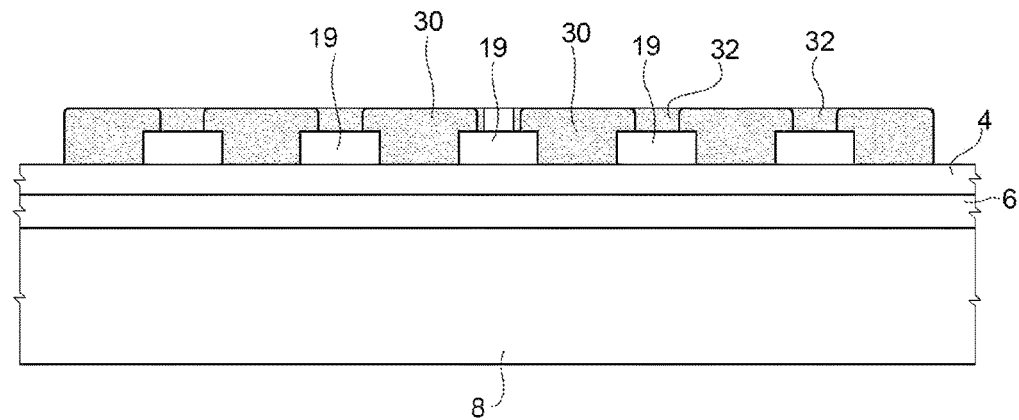
FIG. 6 is a schematic illustration of a portion of a cross-section of the intermediate structure illustrated in FIG. 5, taken along a line of section VI-VI represented in FIG. 5.

As illustrated in greater detail in FIG. 6, each preliminary contact region 30 includes a bottom portion, which contacts the first supporting layer 4 and extends between a corresponding pair of teeth 19, and a top portion, which overlies the bottom portion and extends laterally until it partially overlies also the aforementioned pair of teeth 19. In particular, the top portion includes a first lateral sub-portion and a second lateral sub-portion, which extend, respectively, on the two teeth of the aforementioned pair of teeth 19. Each of the first and second lateral sub-portions may have a width, for example, of 0.1 mm. In this way, the preliminary contact regions 30 maintain the respective positions within the intermediate structure 10, also when they are subjected to stresses induced by removal of the underlying layers (as described hereinafter), or else to the thermo-mechanical stresses caused by the difference between the coefficients of thermal expansion (CTE) of the preliminary contact regions 30 and of the surrounding elements.

With regard to the preliminary pad regions 34, generally they are equal in number to the preliminary contact regions 30. Furthermore, the preliminary pad regions 34 are formed on top of the first base region 14, with which they are in direct contact. In particular, generally the preliminary contact regions 30 are arranged along the sides of an imaginary square, arranged in a central portion of the main body 15 of the first base region 14.

As regards the preliminary track regions 32, generally the preliminary track regions 32 are equal in number to the preliminary contact regions 30. Furthermore, the preliminary track regions 32 are formed on top of the first base region 14, with which they are in direct contact. In particular, each preliminary track region 32 is arranged between a corresponding preliminary pad region 34 and a corresponding preliminary contact region 30, with which it is in direct contact. Consequently, the preliminary track regions 32 form a sort of plurality of arms extending approximately radially, which forms electrical continuity between each preliminary pad region 34 and the corresponding preliminary contact region 30.

Figure 7:
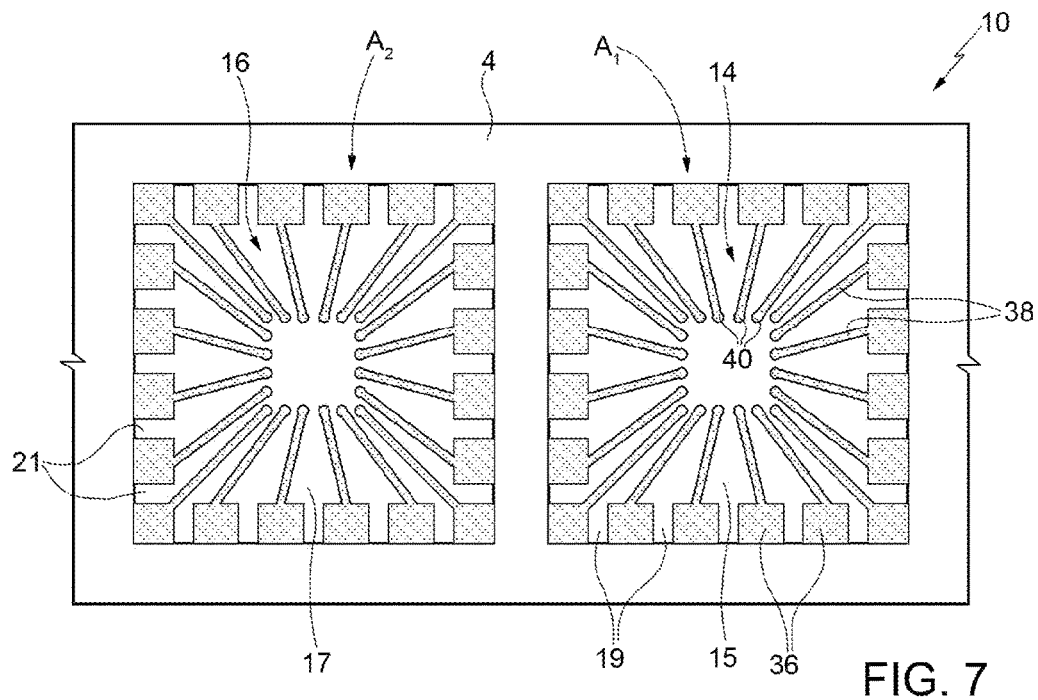

Next, as illustrated in FIG. 7, a sintering process is carried out in a known manner. In detail, the intermediate structure 10 is subjected to a thermal treatment. For instance, where the sintering paste contains copper and tin microparticles, the thermal treatment may envisage a gradual rise in temperature from 25° C. to 215° C., in thirty minutes, the temperature of 215° C. being subsequently maintained for seventy-five minutes. Furthermore, the thermal treatment may be conducted in an environment with a controlled atmosphere having a low oxygen content (for example, less than 200 parts per million (ppm)), which may be obtained thanks to a continuous flow of nitrogen. Alternatively, if the sintering paste contains copper microparticles coated with silver, the thermal treatment may have a duration of thirty minutes and be carried out at a temperature of 170° C.

At the end of sintering, each preliminary contact region 30 forms a corresponding preliminary contact 36. Further, each preliminary track region 32 forms a corresponding track 38, while each preliminary pad region 34 forms a corresponding pad 40. Together the preliminary contacts 36, the tracks 38, and the pads 40 are the lead frame and form a single sintered region, which may have a thickness of, for example, between 10 μm and 50 μm, and is referred to hereinafter also as a first device area $A_1$. FIG. 7, in addition to the first device area $A_1$, also illustrates a second device area $A_2$, formed on the second base region 16.

In a known manner, sintering is irreversible; i.e., even increasing the temperature again up to 270° C., the material does not re-melt.

Figure 8A:
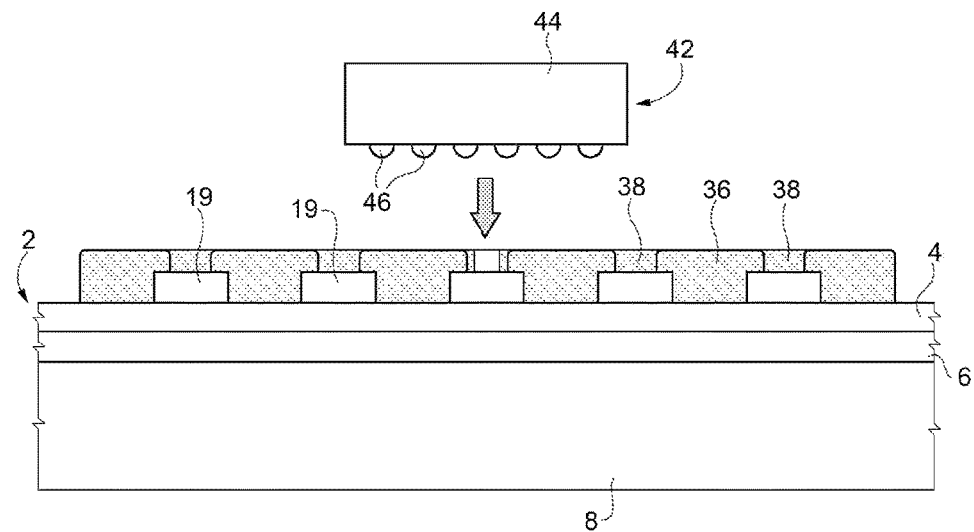
FIG. 8A is a schematic lateral view of a portion of an intermediate structure, during a step of an embodiment of the manufacturing process.

Next, a chip 42 is provided of a known type, as illustrated in FIG. 8A.

The chip 42 includes a semiconductor body 44 and a plurality of contacts 46, which are known as bumps 46 and are formed by a solder paste, obtained, for example, by particles of tin-silver-copper (SAC) in a flux. Arranged between the bumps 46 and the semiconductor body 44 are metallization pads (not illustrated), on which the bumps 46 themselves rest. In particular, the bumps 46 are formed on the metallization pads arranged on the top surface of the semiconductor body 44.

Figure 8B:
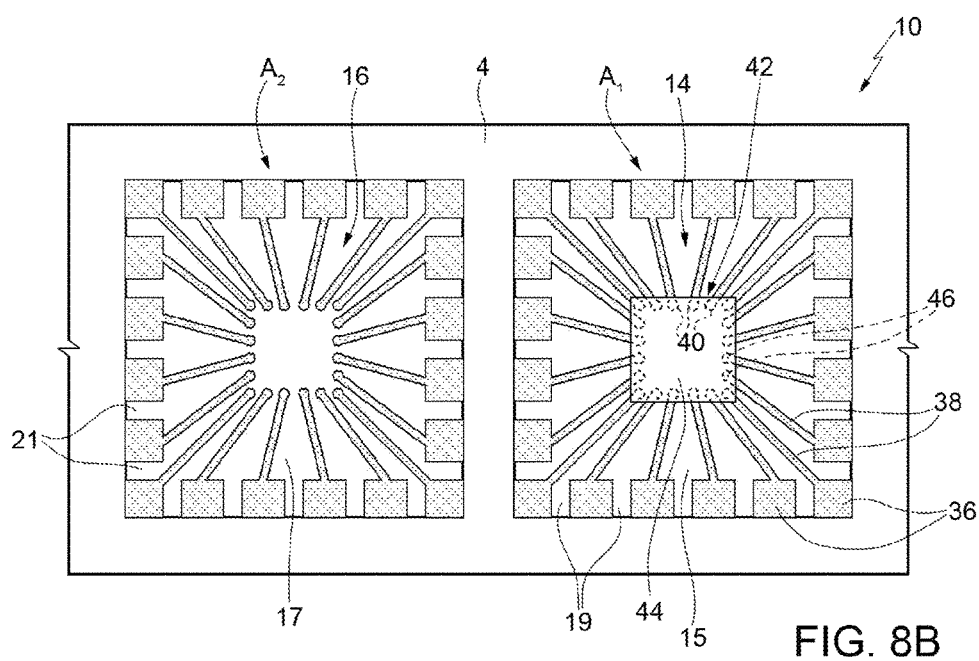
FIG. 8B is a schematic top plan view of a portion of an intermediate structure, during the same step illustrated in FIG. 8A.

As illustrated once again in FIG. 8A and in FIG. 8B, the chip 42 is then coupled to the intermediate structure 10. In particular, the chip 42 is arranged in the so-called flip-chip configuration in such a way that each bump 46 rests on a corresponding pad 40, to which it is temporarily fixed thanks to the adhesive action of the flux. Even though not illustrated or described any further, additional chips are coupled to the intermediate structure 10, on the corresponding device areas.

Figure 9:
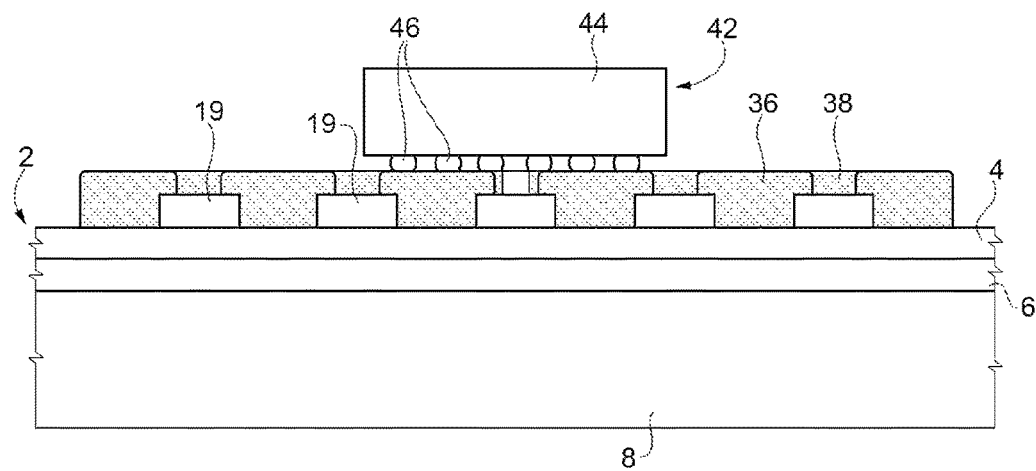
FIGS. 9 and 10 are schematic lateral views of portions of the intermediate structure, during successive steps of an embodiment of the manufacturing process.

Next, as illustrated in FIG. 9, the intermediate structure 10 and the chip 42 are subjected to a further thermal treatment, conducted at a temperature, for example, of 260° C. and in an environment exposed to a nitrogen flow for carrying out reflow soldering. In practice, at the end of the soldering process, each bump 46 is soldered to a corresponding pad 40.

Figure 10:
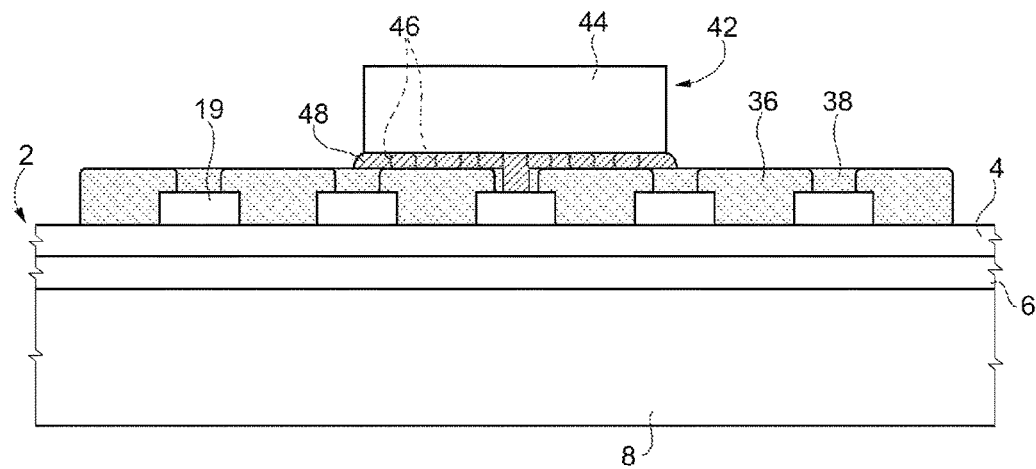

Next, as illustrated in FIG. 10, the gaps present between the bumps 46 are filled, in a known manner, with a filling region 48, also known as underfill. In practice, if the surface defined by the metallization pads (not illustrated) on which the bumps 46 are arranged is referred to as a chip surface, the filling region 48 extends between the chip surface and the elements underlying it, and thus also on a central portion of the first base region 14.

The filling region 48 is formed, for example, by a heat-hardening epoxy resin inside which silicone microparticles are dispersed in order to reducing the coefficient of thermal expansion of the resin itself. In this way, the filling region 48 enables setting-up of a strong mechanical connection between the chip 42 and the first base region 14, as well as reduction of the mechanical stress that acts on the soldering in the presence of thermal variations, this stress is due to the difference between the coefficients of thermal expansion of the chip 42 and of the first base region 14.

In greater detail, formation of the filling region 48 may be preceded by an operation of plasma cleaning (not illustrated), of a known type, and may be followed, once again in a known manner, by a corresponding thermal treatment (not illustrated) at a temperature comprised between 150° C. and 170° C., to obtain complete polymerization of the resin that forms the filling region 48.

Figure 11:
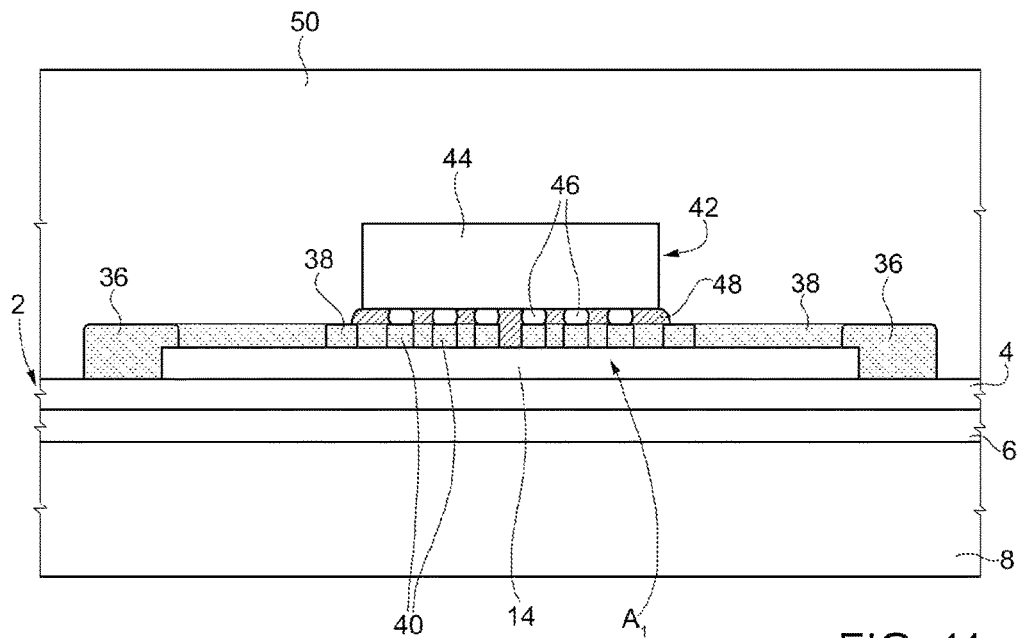
FIGS. 11-14 are schematic cross-sectional views of portions of an intermediate structure, during successive steps of an embodiment of the manufacturing process.

Next, as illustrated in FIG. 11, a dielectric region 50 is formed via injection of a corresponding heat-hardening epoxy resin, dispersed in which are silicon microparticles. In particular, the dielectric region 50 is formed on top of the chip 42, as well as on top of the first device area $A_1$, i.e., on top of the preliminary contacts 36, of the tracks 38 and of the pads 40. Albeit not illustrated, the dielectric region 50 also coats the additional chips present on the intermediate structure 10 and the corresponding device areas.

Figure 12:
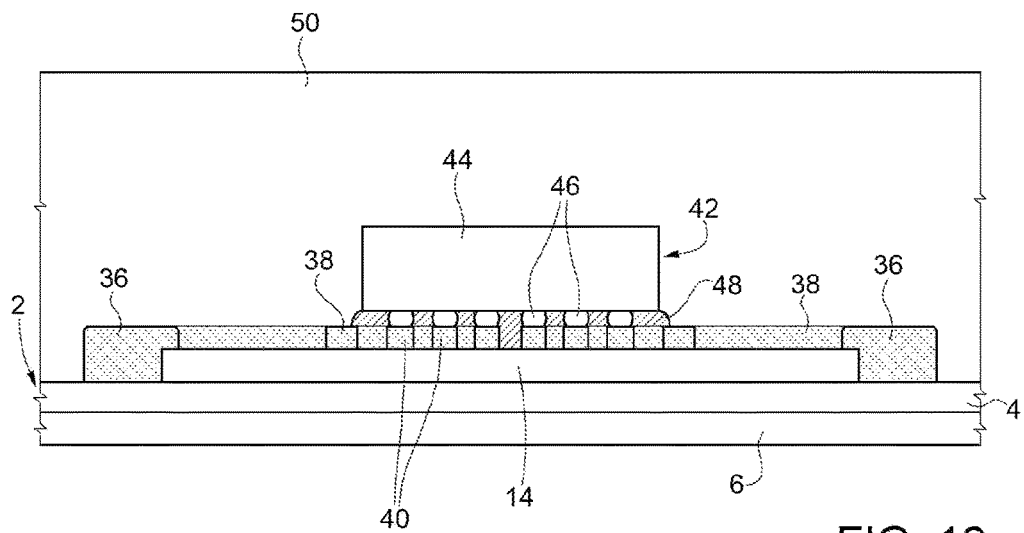

Next, as illustrated in FIG. 12, the plate 8 is removed mechanically from the intermediate structure 10. The plate 8 may then be re-used in other processes.

Figure 13:
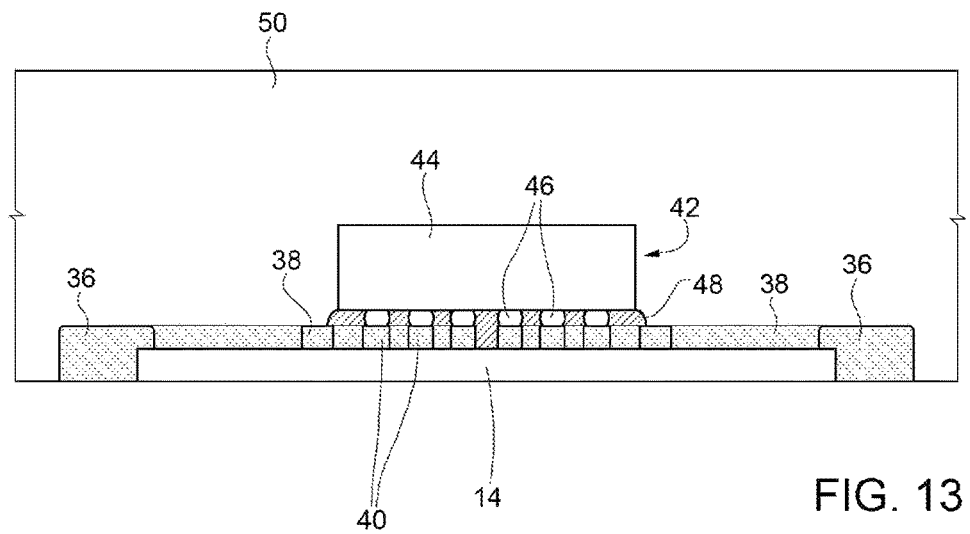

Next, as illustrated in FIG. 13, the supporting structure 2 is removed. In particular, the first and second supporting layers 4, 6 are dissolved by application of a jet of water at a pressure comprised, for example, between 2 bar and 5 bar, and at the temperature of, for example, 70° C.

Next, albeit not illustrated, a further thermal treatment may be carried out, for example, at a temperature of 175° C. The latter thermal treatment is also known as post-molding curing.

Figure 14:
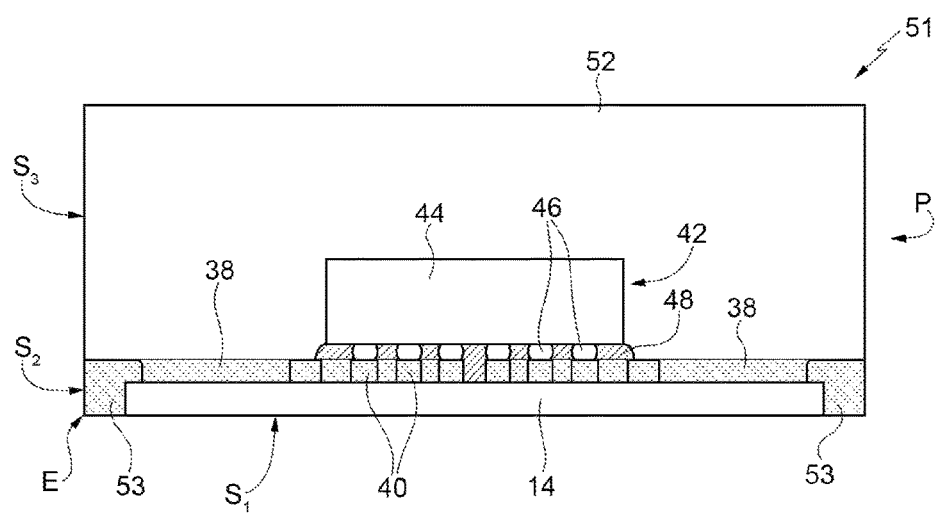

As illustrated in FIG. 14, there are then carried out, in a known manner, the operations of marking and cutting, in such a way as to singulate the intermediate structure 10. In other words, the first device area A1 is separated from the other device areas, and thus also the chip 42 is separated from the other chips. A semiconductor device 51 is thus formed.

Following the cutting operations, the dielectric region 50 forms a package region 52, which covers the chip 42. Furthermore, in the example illustrated in FIG. 14, cutting is carried out in such a way that each preliminary contact 36 forms a corresponding contact 53 of sintered material, which not only gives out onto a bottom surface of the package (designated by $S_1$ in FIG. 14 and formed by the first base region 14), but is also provided with a lateral surface, which is exposed, and thus solderable. In greater detail, the lateral surface of each contact 53 (designated by $S_2$ in FIG. 14) is co-planar with a lateral surface (designated by $S_3$ in FIG. 14) of the package region 52. Furthermore, the intersection between the lateral surface $S_3$ of the package region 52 and the bottom surface $S_1$ of the package region 52 defines an edge E, along which at least part of the contacts 53 extends. In FIG. 14, the package is designated as a whole by P.

In practice, the cutting operation illustrated in FIG. 14 leads generally to formation of a device with a package of the quad-flat no-leads (QFN) type.

Figure 15:
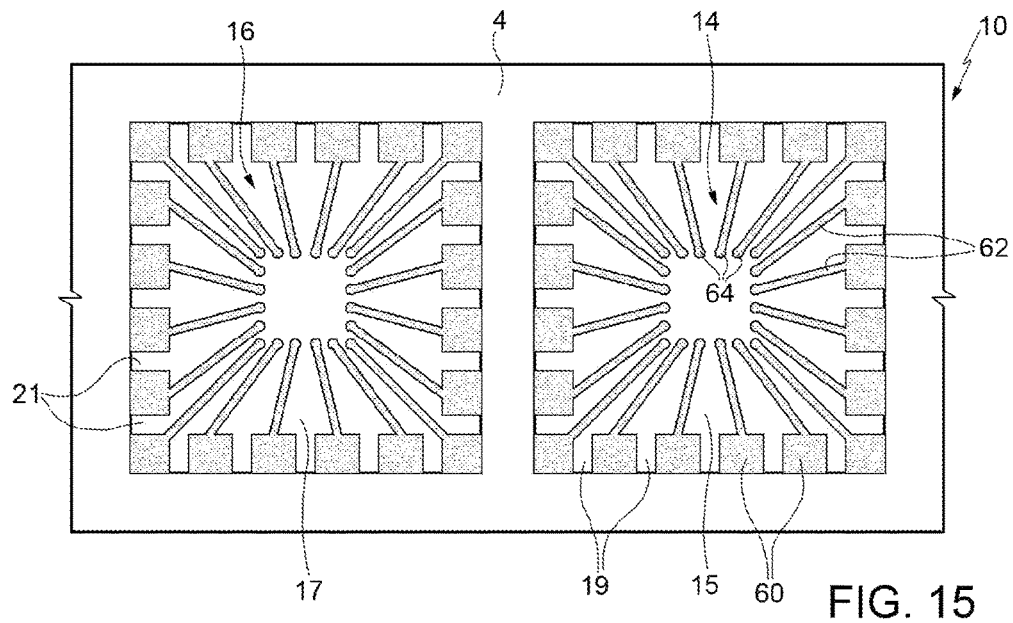
FIGS. 15 and 16 are schematic top plan views of portions of an intermediate structure, during successive steps of an embodiment of the present manufacturing process.

According to an alternate embodiment illustrated in FIG. 15, the preliminary contact regions, the preliminary track regions, and the preliminary pad regions (designated, respectively, by 60, 62, and 64) are formed by a process of jet printing of the same sinterable ink. For instance, this ink may comprise nanoparticles of copper or silver dispersed in a solvent. Further, the ink may be applied at a temperature of at least 150° C. In general, the nanoparticles may have equivalent diameters comprised, for example, between 5 nm and 50 nm.

Figure 16:
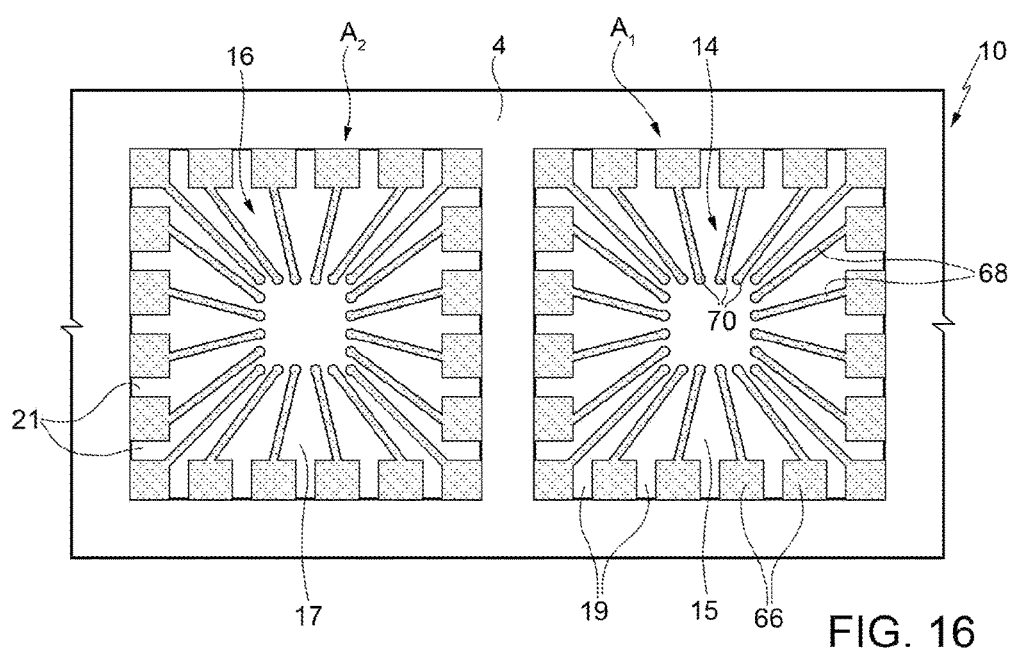

Next, as illustrated in FIG. 16, a sintering process is carried out, for example, in an oven with a controlled atmosphere at the temperature of 150° C., or in any case at a temperature at least equal to the temperature used during the previous jet-printing process.

Following upon sintering, the preliminary contact regions 60, the preliminary track regions 62, and the preliminary pad regions 64 form, respectively, the preliminary contacts (here designated by 66), the tracks (here designated by 68), and the pads (here designated by 70). The preliminary contacts 66, the tracks 68, and the pads 70 are a lead frame and form a single sintered region, which has a thickness of, for example, between 10 μm and 30 μm.

Next, the operations described previously with reference to FIGS. 8A, 8B and 9-14 are carried out.

Figure 17:
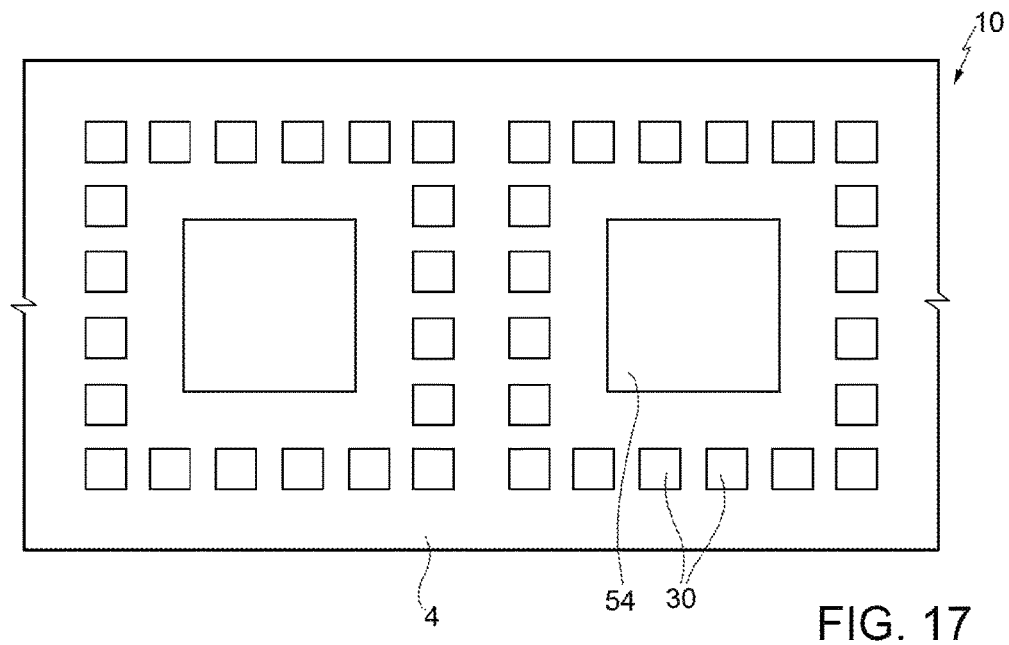
FIGS. 17 and 18 are schematic top plan views of portions of an intermediate structure, during successive steps of an embodiment of the present manufacturing process.

According to another alternate embodiment, illustrated in FIG. 17, the preliminary contact regions 30, and thus the first device area $A_1$, are formed directly on the first supporting layer 4, with which they are in direct contact. The preliminary track regions and the preliminary pad regions are not formed.

In particular, the preliminary contact regions 30 are formed, once again by a process of silk-screen printing, by the sintering paste mentioned with reference to FIG. 5, which, as has been said, may include, for example, copper and tin microparticles, dispersed in an epoxy resin, or otherwise may include, once again by way of example, copper microparticles coated with silver and dispersed in a solvent.

The first device area $A_1$ further includes a preliminary die pad 54, which extends over the first supporting layer 4, with which it is in direct contact. Furthermore, the preliminary die pad 54 is surrounded, at a distance, by the preliminary contact regions 30. In particular, in top plan view the preliminary die pad 54 has, for example, a square shape; the preliminary contact regions 30 are arranged along the sides of the square shape defined by the preliminary die pad 54. The preliminary die pad 54 is of the same sintering paste as that with which the preliminary contact regions 30 are formed.

Figure 18:
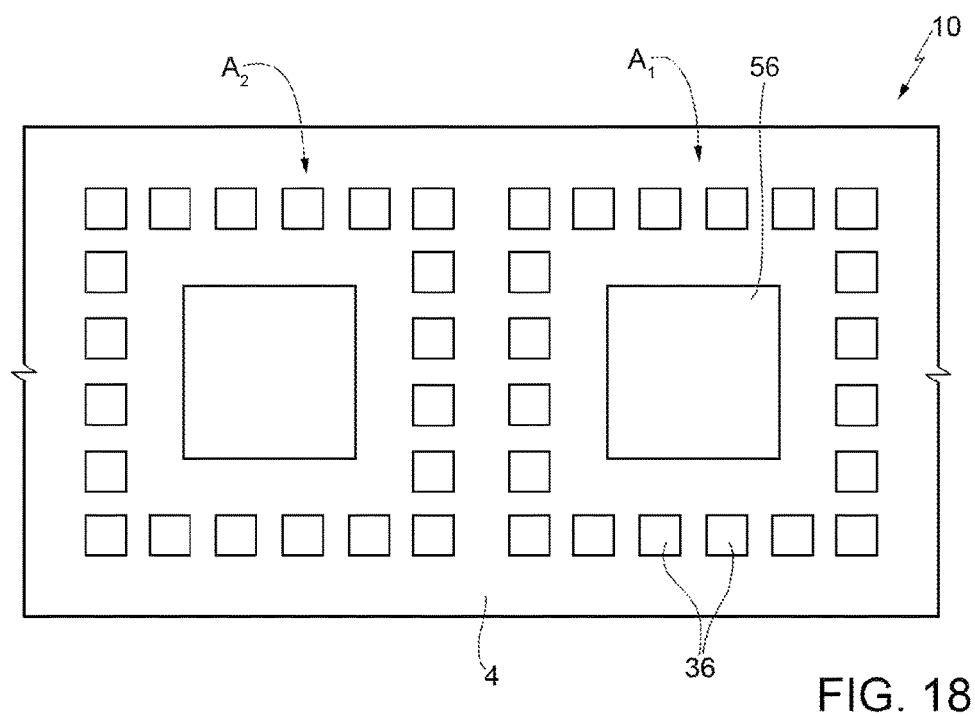

Next, as illustrated in FIG. 18, a sintering process is carried out in a known manner.

In detail, the intermediate structure 10 is subjected to a thermal treatment, of the same type as the one described with reference to FIG. 7, which, as has been said, depends upon the type of sintering paste adopted.

At the end of the sintering process, each preliminary contact region 30 forms a corresponding preliminary contact 36. Further, the preliminary die pad 54 forms a die pad 56. The preliminary contacts 36 and the die pad 56 together form a lead frame and may have thicknesses comprised, for example, between 15 μm and 50 μm.

Next, as illustrated in FIG. 19, formed on the die pad 56 is a preliminary gluing region 74, formed by a conductive glue of a known type.

Then, as illustrated in FIG. 20, the chip (here designated by 72) is arranged on the preliminary gluing region 74. The chip 72 comprises the semiconductor body (here designated by 75) and a bottom dielectric region 77, made, for example, of silicon dioxide. Further, the bottom dielectric region 77 contacts the preliminary gluing region 74.

Next, as illustrated in FIG. 21, a thermal treatment of the intermediate structure 10 is carried out, for example, at 170° C. and with a duration of two hours, in order to harden the preliminary gluing region 74. Following upon the latter thermal treatment, the preliminary gluing region 74 forms a gluing region 76, arranged between the chip 72 and the die pad 56.

Then, a process of plasma cleaning of the preliminary contacts 36 may be carried out in a per se known manner using as reactive gas a mixture of nitrogen (96%) and hydrogen (4%). This operation is not illustrated.

Next, as illustrated in FIG. 22, the chip 72 is electrically connected to the preliminary contacts 36, by corresponding conductive wires 78, made, for example, of silver. Each conductive wire 78 contacts a corresponding preliminary contact 36, with which it forms a corresponding wire bonding. The wire bondings are formed at a maximum temperature of approximately 200° C.

Next, as illustrated in FIG. 23, the aforementioned dielectric region 50 is formed on the chip 72, as well as on the first device area $A_1$, i.e., on the preliminary contacts 36. The dielectric region 50 also coats the additional chips present in the intermediate structure 10 and the corresponding device areas.

Then, as illustrated in FIG. 24, the plate 8 is removed from the intermediate structure 10.

Figure 25:
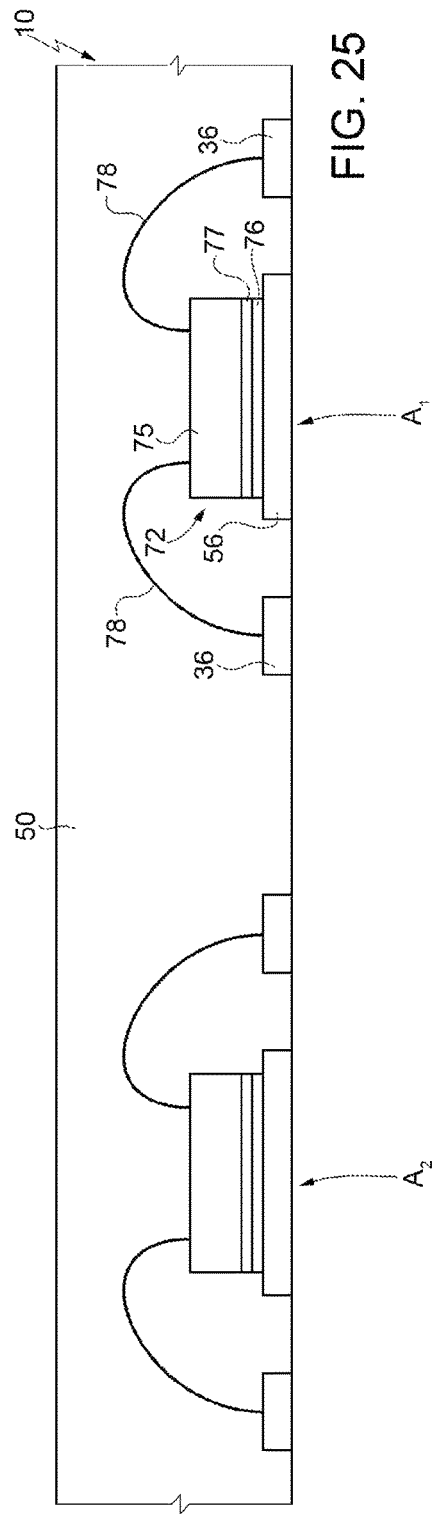

Next, as illustrated in FIG. 25, the supporting structure 2 is removed. In particular, the first and second supporting layers 4, 6 are dissolved by application of a jet of water at a pressure comprised, for example, between 2 bar and 5 bar, and at the temperature of, for example, 70° C.

Then, even though not illustrated, a further thermal treatment may be carried out, for example, at the temperature of 175° C.; the latter thermal treatment functions as "post-molding curing".

Figure 26:
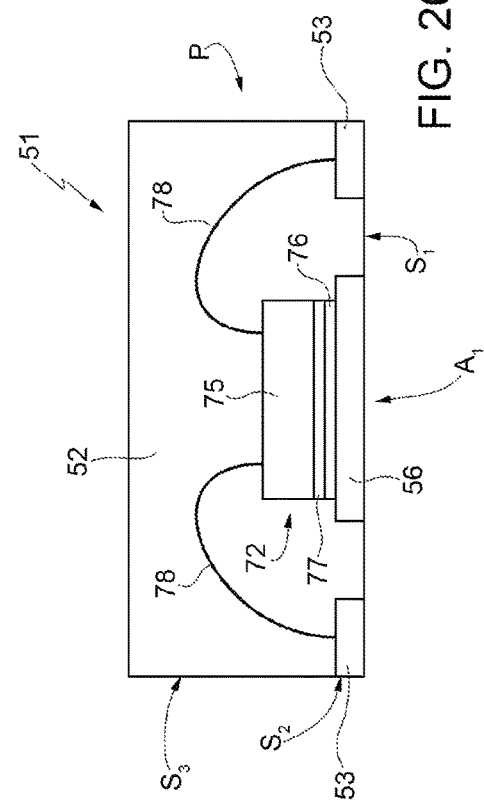
FIGS. 26 and 34 are schematic cross-sectional views of semiconductor devices.

As illustrated in FIG. 26, the operations of marking and cutting are then carried out, in a known manner, in such a way as to singulate the intermediate structure 10 and form the semiconductor device 51.

In particular, generally the package P illustrated in FIG. 26 is of the same type as that illustrated in FIG. 14, but the contacts 53 are electrically connected to the chip 72 by wire bonds. In this case, the bottom surface $S_1$ of the package P is formed in part by the die pad 56 and in part by the package region 52.

According to an alternate embodiment, the chip (illustrated in FIG. 27, where it is designated by 82) includes, in addition to the semiconductor body 75, a bottom metallization 84. In this case, the manufacturing process according to the present disclosure contemplates, after carrying out the operations represented in FIG. 17, arranging the chip 82 so that the bottom metallization 84 contacts the preliminary die pad 54. Next, as illustrated in FIG. 28, the aforementioned sintering process is carried out, following upon which the preliminary contact regions 30 form corresponding preliminary contacts 36, whereas the preliminary die pad 54 forms the die pad 56, which together are the lead frame. Furthermore, on account of the sintering process, the chip 82 remains fixed to the die pad 56.

Next, a process of plasma cleaning of the preliminary contacts 36 may be carried out in a known manner using as reactive gas a mixture of nitrogen (96%) and hydrogen (4%). This operation is not illustrated. Then, the operations described previously with reference to FIGS. 22-26 are carried out.

Figure 29:
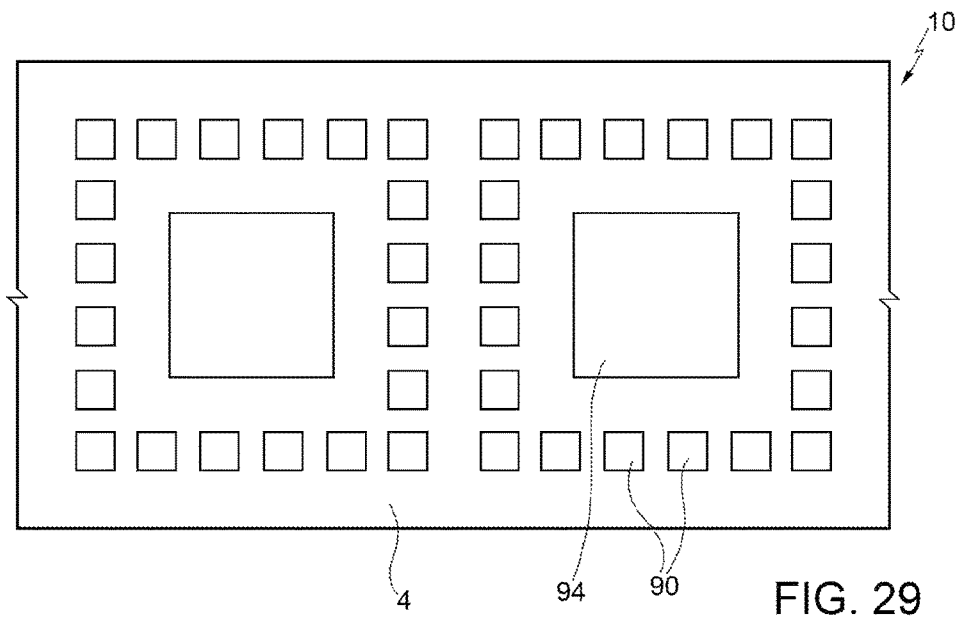
FIGS. 29 and 30 are schematic top plan views of portions of an intermediate structure, during successive steps of an embodiment of the present manufacturing process.

According to another alternate embodiment illustrated in FIG. 29, the preliminary contact regions and the preliminary die pad (designated, respectively, by 90 and 94) are formed by process of jet printing of a sinterable ink, of the same type as the one described with reference to FIG. 15.

Figure 30:
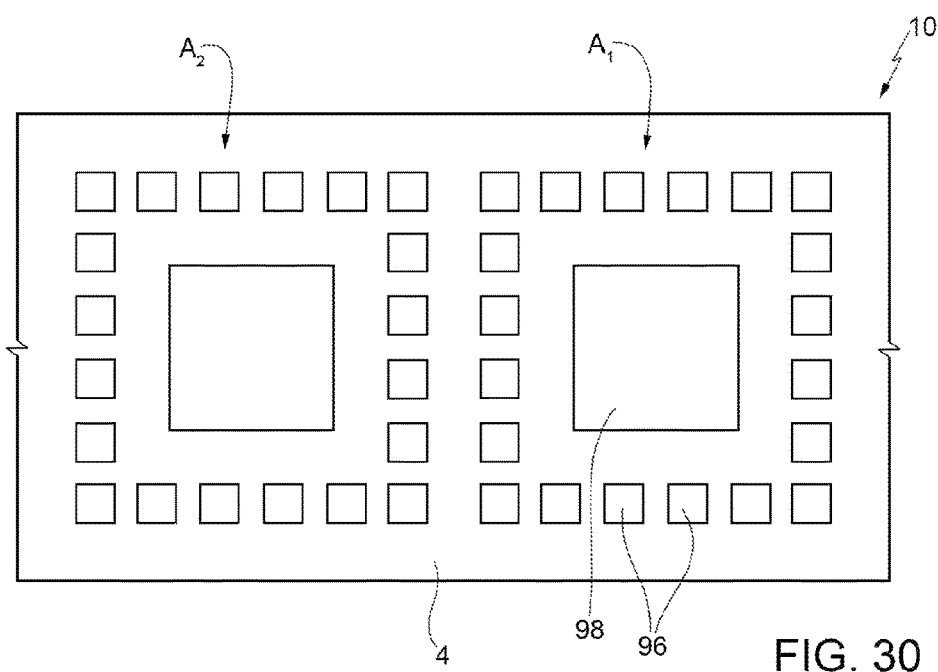

Next, as illustrated in FIG. 30, a sintering process is carried out, for example in an oven with a controlled atmosphere at the temperature of 150° C., or in any case at a temperature at least equal to the temperature used during the previous jet-printing process.

Following upon the sintering operation, the preliminary contact regions 90 and the preliminary die pad 94 form, respectively, the preliminary contacts (here designated by 96) and the die pad (here designated by 98). The preliminary contacts 96 and the die pad 98 have a thickness of, for example, between 10 µm and 30 µm.

Next, the operations described previously with reference to FIGS. 19-28 are carried out.

Irrespective of whether the chip is arranged in a flip-chip configuration or is connected to the contacts by wire bonds, it is further possible for the preliminary contact regions 30, and consequently the preliminary contacts 36, to have heights such that the contacts 53 extend, not only onto the bottom surface $S_1$ of the package P, but also onto a top surface (designated by $S_4$ in FIG. 31) of the package region 52, i.e., onto the top surface of the package itself. The tracks 38 extend, instead, as described previously.

Figure 31:
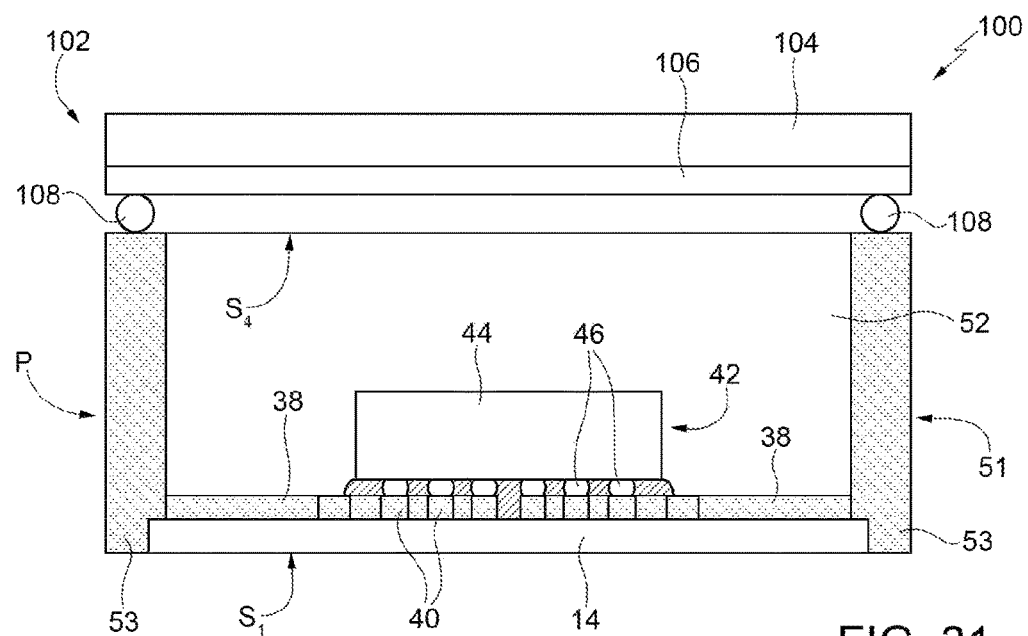
FIG. 31 is a schematic illustration of a cross-section of a three-dimensional electronic structure.

As illustrated once again in FIG. 31, three-dimensional structure 100 may be formed. The three-dimensional structure 100 includes, in addition to the semiconductor device 51, at least one additional device 102, which includes a respective semiconductor body 104, a respective metallization region 106, and a plurality of respective contacts 108. For instance, the metallization region 106 is arranged between the contacts 108 and the semiconductor body 104 of the additional device 102. Further, the contacts 108 of the additional device 102 contact the top portions of corresponding contacts 53 of the semiconductor device 51. Even though FIG. 31 refers, by way of example, to the case where the chip 42 is arranged in flip-chip configuration, this type of package may be implemented also in the case where the chip is connected to the contacts by wire bonds, as well as in the absence of the first base region 14.

The manufacturing methods according to the teachings of the present disclosure provide certain advantages. In particular, the present manufacturing method makes it possible to avoid having lead-frame strips. Furthermore, the packages formed with the present manufacturing method are characterized by lower weights, on account of the lightness of the sintered material, as well as on account of a smaller thickness. In the case of a flip-chip arrangement, the packages may have thicknesses in the region of 0.2 mm. Again, the pitch of the contacts may be between 200 µm and 350 µm.

In conclusion, it is clear that modifications and variations may be made to what has been described and illustrated herein without departing from the scope of the present invention, as defined in the annexed claims.

Figure 34:
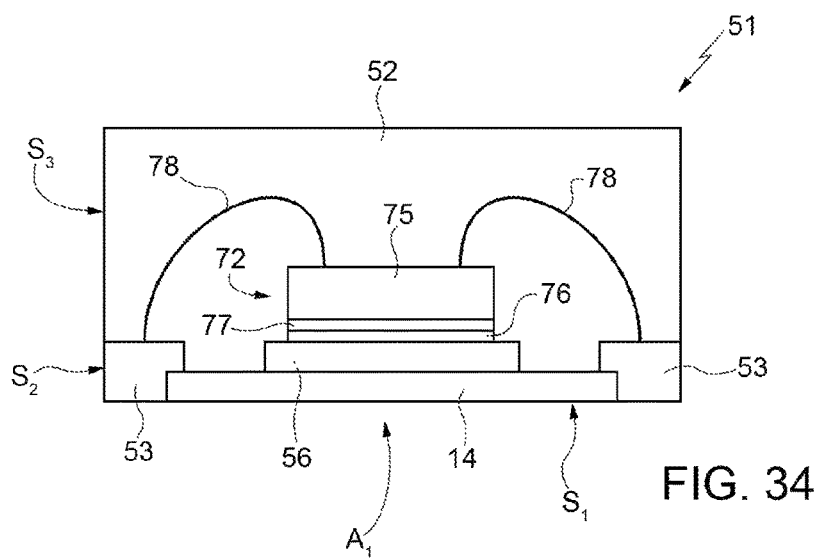
Figure 32:
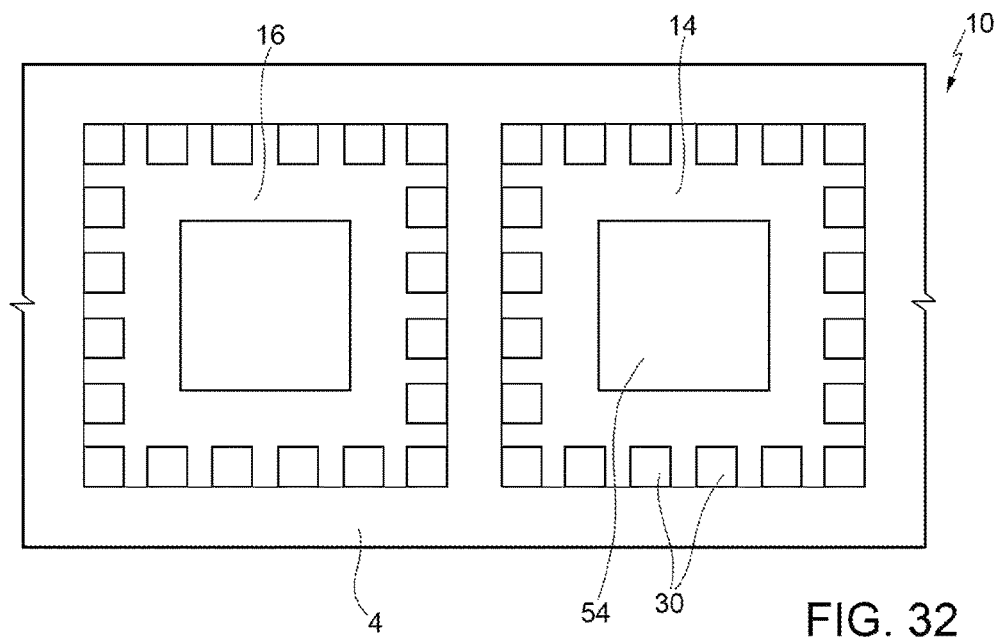
FIGS. 32 and 33 are schematic top plan views of portions of an intermediate structure, during successive steps of an embodiment of the present manufacturing process.
Figure 33:
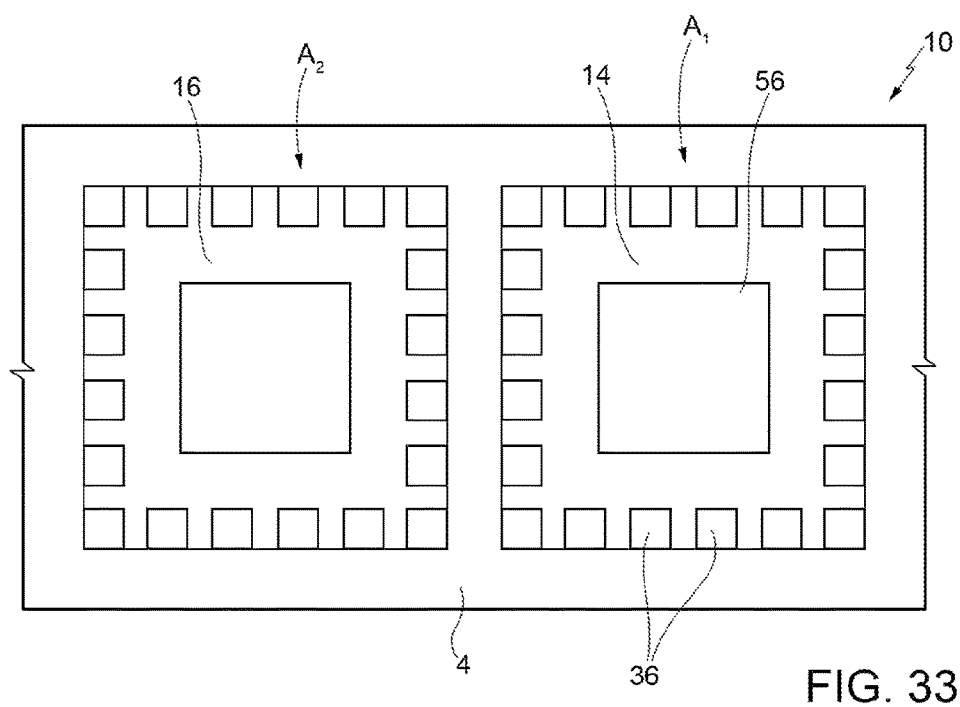

For example, as illustrated in FIG. 32, it is possible to use the third layer 12, and thus the aforementioned first and second base regions 14, 16, also in the case where the chip is electrically connected to the contacts by wire bonds. In this case, after the operations referred to in FIG. 4 have been carried out, the preliminary contact regions 30 are formed, as described with reference to FIG. 5, i.e., by a process of silk-screen printing. Furthermore, with this process of silk-screen printing, the preliminary die pad 54 is likewise formed on the main body 15 of the first base region 14. The preliminary contact regions 30 are thus of the same type as what has been described with reference to FIG. 6 and present the same advantages, which are accomplished by use of the first base region 14, irrespective of the type of methodology used for applying the sintering paste. A subsequent sintering treatment, of the same type as the one described with reference to FIG. 18, leads to formation of the preliminary contacts 36 and of the die pad 56, as illustrated in FIG. 33. Next, the operations described previously with reference to FIGS. 19-28 may be carried out. In this way, there is obtained, for example, the semiconductor device 51 illustrated in FIG. 34.

Figure 35:
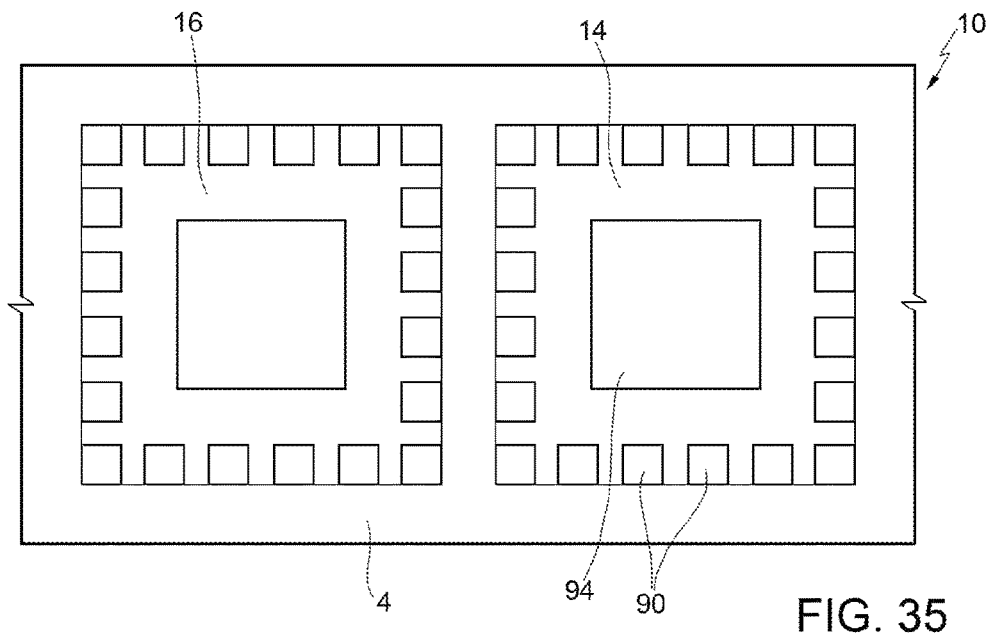
FIGS. 35 and 36 are schematic top plan views of portions of an intermediate structure, during successive steps of an embodiment of the present manufacturing process.
Figure 36:
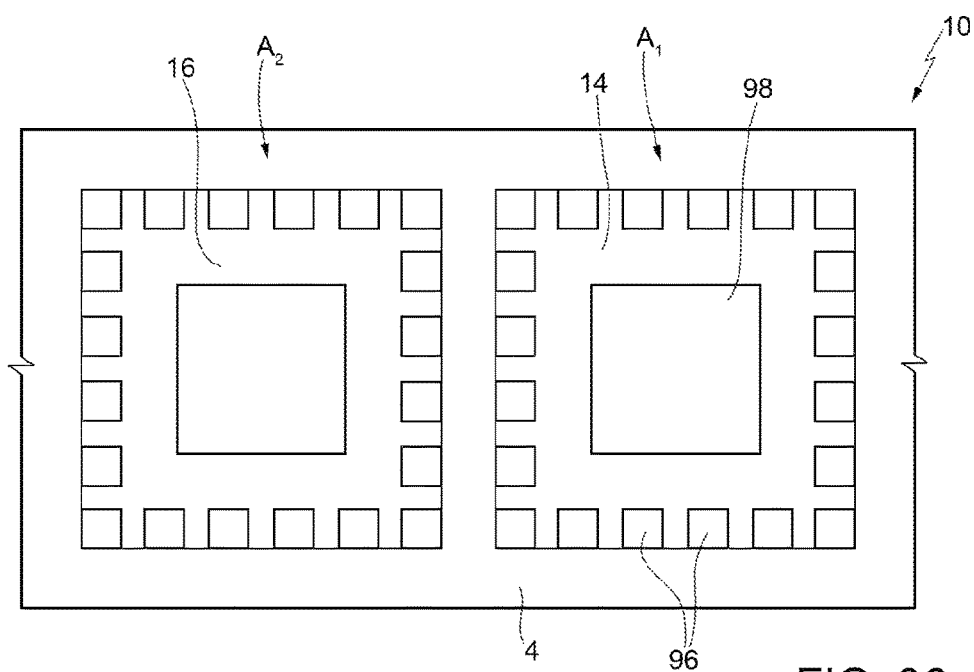

As illustrated in FIG. 35, also in the case where the preliminary die pad is formed on the first base region 14, it is possible for it to be formed by a jet-printing process, with the characteristics described previously. In this case, the jet print leads to the formation of the preliminary contact regions and of the preliminary die pad (designated, respectively, by 90 and 94); the preliminary die pad 94 is arranged on the first base region 14. A subsequent sintering process of the same type as the one described with reference to FIG. 30 leads to formation of the preliminary contacts 96 and of the die pad 98, as illustrated in FIG. 36. Next, the operations described previously with reference to FIGS. 19-28 may be carried out.

In general, the present manufacturing method may further be used for forming packages different from QFN packages, such as, for example, the packages of the land-grid-array (LGA) type.

As regards the filling region 48, this may be absent. Furthermore, instead of reflow soldering, it is possible to implement, for example, thermosonic bonding.

As regards the gluing region 76, this may not be present. In this case, it is, for example, possible to apply on the bottom dielectric region 77 of the chip 72 a bi-adhesive layer (not illustrated), whether conductive or insulating. Next, the chip 72 is fixed to the die pad 56 thanks to the action of the bi-adhesive layer.

As regards the supporting structure 2, instead of being formed by the first supporting layer 4 and the second supporting layer 6, it may be formed by just one water-soluble layer (not illustrated). In this case, the soluble layer is formed, for example, by injectable polyvinyl acetate, or else by a bio-material. Furthermore, the soluble layer may include glass fiber or silicon microparticles.

In greater detail, the soluble layer may have the following characteristics: a thickness between 0.2 mm and 1.0 mm, an elastic modulus of 10 GPa at room temperature, and 5 GPa RT; coefficient of cubic expansion lower than 200 ppm; temperature of vitreous transition higher than 150° C.; melting point higher than 200° C.; and complete solubility in water at 80° C. (except for the glass-fiber/silicon microparticles).

The invention claimed is:

1. A surface-mount electronic device, comprising:
   a body of semiconductor material;
   an insulating layer having a planar and continuous top surface and a perimeter defined by side edges, at least one side edge including a plurality of lateral teeth delimiting adjacent recesses; and
   a lead frame including a plurality of contact terminals electrically connected to the body of semiconductor material, said contact terminals filling the recesses delimited by the plurality of lateral teeth and partially overlying the planar and continuous top surface of the insulating layer.

2. The surface-mount electronic device according to claim 1, wherein the insulating layer has a bottom surface; and wherein the plurality of contact terminals extends to said bottom surface.

3. The surface-mount electronic device according to claim 2, wherein the plurality of contact terminals filling the recesses extends to said at least one side edge of the insulating layer.

4. The surface-mount electronic device according to claim 1, wherein said lead frame comprises a plurality of pads and a plurality of tracks disposed on the planar and continuous top surface of the insulating layer, each track of the plurality of tracks electrically connecting a corresponding pad to a corresponding contact terminal of the plurality of contact terminals.

5. The surface-mount electronic device according to claim 1, further comprising a die pad, the body of semiconductor material being arranged on the die pad and being electrically connected to the plurality of contact terminals by wire bonds.

6. The surface-mount electronic device according to claim 1, further comprising a package dielectric region overlying the body of semiconductor material, the insulating layer, and at least part of the lead frame.

7. The surface-mount electronic device according to claim 6, wherein a package dielectric region forms a front surface of the package, and wherein the plurality of contact terminals extend to said front surface.

8. The surface-mount electronic device according to claim 1, wherein each one of the plurality of contact terminals has a bottom surface, and further comprising:
a package delimited by a bottom surface, the bottom surfaces of each of the plurality of contact terminals being co-planar with the bottom surface of the package.

9. The surface-mount electronic device according to claim 1, wherein said surface-mount electronic device is a quad-flat no-leads type or a land-grid-array type.

10. A surface-mount electronic device, comprising:
a lead frame including a die pad and a plurality of contact terminals;
a body of semiconductor material arranged on the die pad and being electrically connected to the plurality of contact terminals by wire bonds; and
a package including the lead frame and body of semiconductor material, comprising:
an insulating layer; and
a package dielectric region overlying the body of semiconductor material, the insulating layer and at least part of the lead frame;
wherein the insulating layer has a planar and continuous top surface and further includes a side edge with a plurality of lateral teeth delimiting adjacent recesses; and
wherein each contact terminal of the plurality of contact terminals extends into a corresponding recess and partially overlies the planar and continuous top surface of the insulating layer.

11. The surface-mount electronic device according to claim 10, wherein the package dielectric region forms a front surface of the package, and wherein the plurality of contact terminals extend to said front surface.

12. The surface-mount electronic device according to claim 10, wherein said surface-mount electronic device is a quad-flat no-leads type or a land-grid-array type.

13. The surface-mount electronic device according to claim 10, wherein the plurality of contact terminals is formed of a sintered material.

14. A surface-mount electronic device, comprising:
a body of semiconductor material; and
a plurality of contact terminals electrically connected to the body of semiconductor material; and
a package delimited by a bottom surface and at least one lateral surface, wherein the plurality of contact terminals extends to said bottom surface and said at least one lateral surface;
wherein the package comprises:
an insulating layer having a planar and continuous top surface; and
a package dielectric region overlying the body of semiconductor material and the insulating layer;
wherein the insulating layer has a side edge including a plurality of lateral teeth delimiting adjacent recesses; and
wherein each of the plurality of contact terminals extends into a corresponding recess and partially overlies the planar and continuous top surface of the insulating layer.

15. The surface-mount electronic device according to claim 14, further comprising a lead frame including a plurality of pads and a plurality of tracks disposed on the planar and continuous top surface of the insulating layer, each track of the plurality of tracks electrically connecting a corresponding pad to a corresponding contact terminal of the plurality of contact terminals.

16. The surface-mount electronic device according to claim 14, wherein said surface-mount electronic device is a quad-flat no-leads type or a land-grid-array type.

17. The surface-mount electronic device according to claim 14, wherein bottom surfaces of each of the plurality of contact terminals are co-planar with the bottom surface of the package.

18. The surface-mount electronic device according to claim 14, wherein the plurality of contact terminals is formed of a sintered material.

19. The surface-mount electronic device according to claim 6, wherein a surface of the package dielectric region contacts the planar and continuous top surface of the insulating layer.

20. The surface-mount electronic device according to claim 10, wherein a surface of the package dielectric region contacts the planar and continuous top surface of the insulating layer.

21. The surface-mount electronic device according to claim 14, wherein a surface of the package dielectric region contacts the planar and continuous top surface of the insulating layer.

* * * * *